US009429415B2

United States Patent
Sekiguchi

(10) Patent No.: US 9,429,415 B2
(45) Date of Patent: Aug. 30, 2016

(54) SURFACE EMITTING LASER HAVING A FACTOR OF EQUIVALENT REFRACTIVE INDEX CONSTRAINT BY SCALED CENTRAL WAVELENGTHS AND OPTICAL COHERENCE TOMOGRAPHY APPARATUS EQUIPPED WITH SUCH SURFACE EMITTING LASER

(71) Applicant: CANON KABUSHIKI KAISHA, Tokyo (JP)

(72) Inventor: Yoshinobu Sekiguchi, Machida (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/198,389

(22) Filed: Mar. 5, 2014

(65) Prior Publication Data

US 2014/0253925 A1    Sep. 11, 2014

(30) Foreign Application Priority Data

Mar. 7, 2013  (JP) ................. 2013-045585

(51) Int. Cl.
*H01S 5/183* (2006.01)
*G01B 9/02* (2006.01)
*H01S 5/10* (2006.01)

(52) U.S. Cl.
CPC ....... *G01B 9/02091* (2013.01); *H01S 5/18322* (2013.01); *H01S 5/18363* (2013.01);
(Continued)

(58) Field of Classification Search
CPC ........... G01B 9/02091; H01S 5/18363; H01S 5/18322; H01S 5/18366; H01S 5/1039; H01S 5/1021; H01S 5/18311; H01S 5/18358; H01S 1/18375; H01S 5/18377; H01S 5/18383

USPC ................................... 356/479, 497
See application file for complete search history.

(56) References Cited

U.S. PATENT DOCUMENTS 8,189,643 B2     5/2012  Chang-Hasnain et al.
2007/0183643 A1*  8/2007  Jayaraman ............ 382/131
(Continued)

FOREIGN PATENT DOCUMENTS

EP   2557441 A1   2/2013
JP   2004-296972 A  10/2004
JP   2005-222968 A   8/2005

OTHER PUBLICATIONS

Chung Il-Sug, et al; "Broadband MEMS-Tunable High-Index-Contrast Subwavelength Grating Long-Wavelength VCSEL;" IEEE Journal of Quantum Electronics, vol. 46, No. 9, Sep. 2010; pp. 1245-1253.

(Continued)

*Primary Examiner* — Michael P Lapage
(74) *Attorney, Agent, or Firm* — Canon USA, Inc. IP Division

(57) ABSTRACT

A surface emitting laser according to the present invention includes a lower reflector, a first spacer layer, an active layer, a second spacer layer composed of a semiconductor material, a gap section formed of at least one of vacuum and gas, and an upper reflector in the written order, and also includes a control mechanism that changes a distance between an interface between the second spacer layer and the gap section and an interface between the upper reflector and the gap section. An optical path length $n_{eff} \times d$ extending from an interface between the lower reflector and the first spacer layer to an interface between the second spacer layer and the gap section satisfies a predetermined relationship.

10 Claims, 10 Drawing Sheets

(52) U.S. Cl.
CPC .......... *H01S5/18366* (2013.01); *H01S 5/1021* (2013.01); *H01S 5/1039* (2013.01); *H01S 5/18311* (2013.01); *H01S 5/18358* (2013.01)

(56) References Cited

U.S. PATENT DOCUMENTS

| | | | |
|---|---|---|---|
| 2008/0159468 A1* | 7/2008 | Chong | 378/4 |
| 2011/0080591 A1* | 4/2011 | Johnson et al. | 356/479 |
| 2012/0257210 A1 | 10/2012 | Whitney | |
| 2014/0160488 A1* | 6/2014 | Zhou | 356/479 |

OTHER PUBLICATIONS

E. Staffan Björlin, Qi Chen, Garrett D. Cole, Toshio Kimura, Shaomin Wu, Chad S. Wang, Noel C. MacDonald, and John E. Bowers, "First Demonstration of a MEMS Tunable Vertical-Cavity SOA", IEEE Photonics Technology Letters, vol. 16, No. 6, Jun. 1, 2004, pp. 1438-1440. IEEE Service Center, Piscataway, NJ, US.

Fred Sugihwo, "Design and fabrication of wavelength tunable optoelectronic devices", Stanford University ISBN: 978-0-59-907010-3, Aug. 1998.

Fred Sugihwo et al. "Broadly-Tunable Narrow-Linewidth Micronachined Laser/Photodetector and Phototransistor", IEEE, USA, Dec. 6, 1998, pp. IEDM98-665-IEDM98-668.

Garrett D. Cole et al. "Short-wavelength MEMS-tunable VCSELs", Optics Express, vol. 16 Issue 20, Sep. 29, 2008. pp. 16093-16103. Optical Society of America, Washington DC.

M. C. Larson et al. "Continuously tunable micro-electromechanical vertical-cavity surface-emitting lasers". International Journal of Optoelectronics, 1995, vol. 10, No. 5, pp. 401-408. XP000635948, Taylor & Francis Ltd., London, GB.

* cited by examiner

FIG. 5

| | OPTICAL PATH LENGTH $n_{eff} \times d$ OF FIRST RESONATOR | | | | | | |
|---|---|---|---|---|---|---|---|
| | $3\lambda_0$ | $(3 + 1/8)\lambda_0$ | $(3 + 3/16)\lambda_0$ | $(3 + 1/4)\lambda_0$ | $(3 + 5/16)\lambda_0$ | $(3 + 3/8)\lambda_0$ | $(3 + 1/2)\lambda_0$ |
| OSCILLATION-WAVELENGTH VARIABLE RANGE (μm) | 0.049 μm (0.845 TO 0.894 μm) | 0.038 μm (0.856 TO 0.894 μm) | 0.057 μm (0.839 TO 0.896 μm) | 0.075 μm (0.821 TO 0.896 μm) | 0.073 μm (0.823 TO 0.896 μm) | 0.061 μm (0.827 TO 0.888 μm) | 0.045 μm (0.846 TO 0.891 μm) |

FIG. 8

| $n_{eff} \times d$ | $3\lambda_0$ | $(3 + 1/8)\lambda_0$ | $(3 + 3/16)\lambda_0$ | $(3 + 1/4)\lambda_0$ | $(3 + 5/16)\lambda_0$ | $(3 + 3/8)\lambda_0$ | $(3 + 1/2)\lambda_0$ |
|---|---|---|---|---|---|---|---|
| $n_{eff} \times du$ | $(1/2)\lambda_0$ | $(1/2 + 1/8)\lambda_0$ | $(1/2 + 3/16)\lambda_0$ | $(1/2 + 1/4)\lambda_0$ | $(1/2 + 5/16)\lambda_0$ | $(1/2 + 3/8)\lambda_0$ | $(1/2 + 1/2)\lambda_0$ |
| OSCILLATION-WAVELENGTH VARIABLE RANGE (μm) | 0.049 (0.845 TO 0.894) | 0.038 (0.856 TO 0.894) | 0.057 (0.839 TO 0.896) | 0.075 (0.821 TO 0.896) | 0.073 (0.823 TO 0.896) | 0.061 (0.827 TO 0.888) | 0.045 (0.846 TO 0.891) |

FIG. 10

| | OPTICAL PATH LENGTH $n_{eff} \times d$ OF FIRST RESONATOR | | | | |
|---|---|---|---|---|---|
| | $(1 + 1/8)\lambda_0$ | $(1 + 3/16)\lambda_0$ | $(1 + 1/4)\lambda_0$ | $(1 + 5/16)\lambda_0$ | $(1 + 3/8)\lambda_0$ |
| | 0.101 | 0.138 | 0.134 | 0.122 | 0.102 |
| OSCILLATION-WAVELENGTH VARIABLE RANGE (μm) | (1.043 TO 1.144) | (1.006 TO 1.144) | (1.004 TO 1.138) | (1.007 TO 1.129) | (1.026 TO 1.128) |

SURFACE EMITTING LASER HAVING A FACTOR OF EQUIVALENT REFRACTIVE INDEX CONSTRAINT BY SCALED CENTRAL WAVELENGTHS AND OPTICAL COHERENCE TOMOGRAPHY APPARATUS EQUIPPED WITH SUCH SURFACE EMITTING LASER

BACKGROUND OF THE INVENTION

1. Field of the Invention

The present invention relates to surface emitting lasers and optical coherence tomography apparatuses equipped with such surface emitting lasers.

2. Description of the Related Art

A vertical cavity surface emitting laser (sometimes referred to as "VCSEL" hereinafter) is a laser device that emits a laser beam vertically relative to an in-plane direction of a substrate. This surface emitting laser forms a resonator in the vertical direction relative to the substrate by sandwiching an active layer from above and below with two reflectors and emits light in the vertical direction relative to the substrate.

In a known surface emitting laser, a laminate, which includes an active layer and a lower reflector, and an upper reflector are disposed facing each other with a gap section (sometimes referred to as "air gap") interposed therebetween (see Japanese Patent Laid-Open No. 2004-296972). This surface emitting laser is capable of varying the laser oscillation wavelength by changing the distance of the air gap.

In the surface emitting laser disclosed in Japanese Patent Laid-Open No. 2004-296972, the antinode of a standing wave is located at the interface between the laminate and the air gap so that the threshold current is reduced.

As a result of a diligent examination performed by the present inventor, the present inventor discovered a problem in a surface emitting laser such as that disclosed in Japanese Patent Laid-Open No. 2004-296972. Specifically, with the configuration in which the antinode of a standing wave is located at the interface between the laminate and the air gap, that is, when the optical path length from the lower reflector to the aforementioned interface is an integral multiple of $\lambda/2$ ($\lambda$ denoting a laser oscillation wavelength), the variable wavelength range of the oscillation wavelength is small. In view of this, the present invention provides a surface emitting laser with a wide variable wavelength range for the laser oscillation wavelength.

SUMMARY OF THE INVENTION

The present invention provides a surface emitting laser that includes a lower reflector, a first spacer layer, an active layer, a second spacer layer composed of a semiconductor material, a gap section formed of at least one of vacuum and gas, and an upper reflector in the written order, and also includes a control mechanism that changes a distance between an interface between the second spacer layer and the gap section and an interface between the upper reflector and the gap section. An optical path length $n_{eff} \times d$ extending from an interface between the lower reflector and the first spacer layer to an interface between the second spacer layer and the gap section satisfies a relationship according to expression (1):

$$(ma/2+3/16)\lambda_0 \leq n_{eff} \times d \leq (ma/2+3/8)\lambda_0 \qquad (1)$$

In expression (1), ma denotes an integer of 2 or larger, and $\lambda_0$ denotes a central wavelength of a reflection wavelength band of the upper reflector or the lower reflector.

Further features of the present invention will become apparent from the following description of exemplary embodiments with reference to the attached drawings.

BRIEF DESCRIPTION OF THE DRAWINGS

FIG. 5 illustrates an optical path length of first resonator $n_{eff} \times d$ and an oscillation-wavelength variable range when a surface emitting laser according to Example 1 of the present invention is used.

FIG. 8 illustrates an optical path length $n_{eff} \times du$ and the oscillation-wavelength variable range when a surface emitting laser according to Example 2 of the present invention is used.

FIG. 10 illustrates an optical path length of first resonator $n_{eff} \times d$ and an oscillation-wavelength variable range when the surface emitting laser according to Example 3 of the present invention is used.

DESCRIPTION OF THE EMBODIMENTS

Surface Emitting Laser

Figure 1:
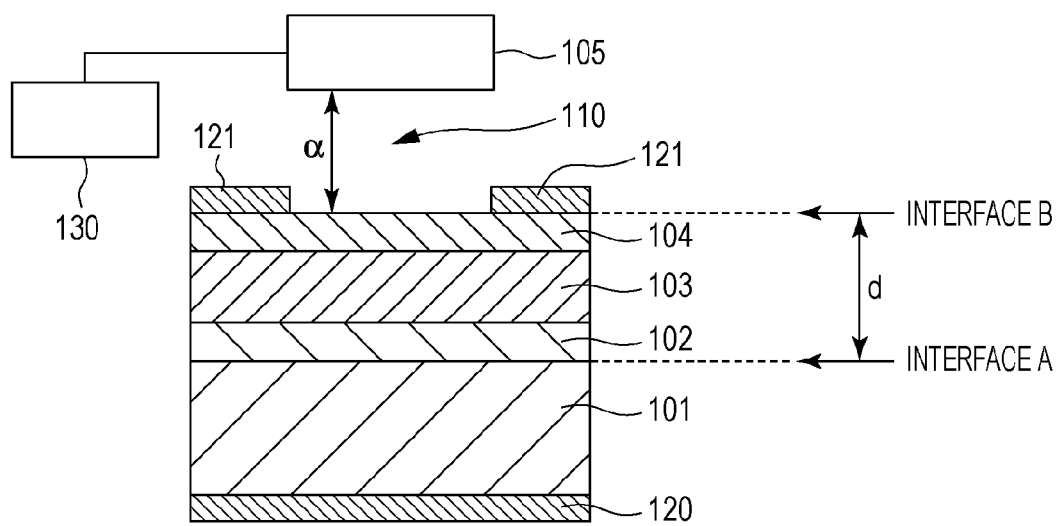
FIG. 1 is a schematic cross-sectional view of a surface emitting laser according to a first embodiment of the present invention.

A surface emitting laser according to the present invention includes a lower reflector, a first spacer layer, an active layer, a second spacer layer composed of a semiconductor material, a gap section formed of at least one of vacuum and gas, and an upper reflector in the written order, and also includes a control mechanism that changes a distance between an interface between the second spacer layer and the gap section and an interface between the upper reflector and the gap section. An optical path length $n_{eff} \times d$ extending from an interface between the lower reflector and the first spacer layer to an interface between the second spacer layer and the gap section satisfies a relationship according to expression (1):

$$(ma/2+3/16)\lambda_0 \leq n_{eff} \times d \leq (ma/2+3/8)\lambda_0 \qquad (1)$$

In expression (1), ma denotes an integer of 2 or larger, and $\lambda_0$ denotes a central wavelength of a reflection wavelength band of the upper reflector or the lower reflector.

In this case, d denotes the distance from the interface between the lower reflector and the first spacer layer to the interface between the second spacer layer and the gap section. Moreover, $n_{\mathit{eff}}$ denotes an equivalent refractive index of the layers interposed between the interface between the lower reflector and the first spacer layer and the interface between the second spacer layer and the gap section.

The surface emitting laser according to the present invention can also be expressed as follows. For example, the surface emitting laser includes a lower reflector, a first spacer layer disposed on the lower reflector, an active layer disposed on the first spacer layer, a second spacer layer that is composed of a semiconductor material and is disposed on the active layer, and an upper reflector provided above the second spacer layer with a gap section interposed therebetween. An oscillation wavelength is varied by changing a distance extending from an interface between the second spacer layer and the gap section to an interface between the upper reflector and the gap section. The distance d from the interface between the lower reflector and the first spacer layer to the interface between the second spacer layer and the gap section is controlled so as to satisfy the relationship according to expression (1)' below.

$$(ma/2+3/16)(\lambda_0/n_{\mathit{eff}}) \leq d \leq (ma/2+3/8)(\lambda_0/n_{\mathit{eff}}) \quad (1)'$$

In this case, the expression "disposed on" is not intended to specify the stacked order.

Furthermore, without using the concept of the term "gap section", it is also possible to consider that the second spacer layer and the upper reflector are spaced apart from each other. In this case, the distance d refers to the distance from the interface between the lower reflector and the first spacer layer to the upper-reflector-side surface of the second spacer layer. In the following description, a distributed Bragg reflector may sometimes be simply referred to as "DBR", and a multiple quantum well may sometimes be simply referred to as "MQW".

Embodiments of the present invention will now be described below.

First Embodiment

A surface emitting laser according to a first embodiment will be described with reference to FIG. 1. FIG. 1 is a schematic cross-sectional view of the surface emitting laser according to the first embodiment.

The surface emitting laser according to the first embodiment at least includes an n-DBR (lower reflector) 101, an n-clad layer (first spacer layer) 102 disposed on the n-DBR 101, an MQW active layer (active layer) 103 disposed on the n-clad layer 102, and a p-clad layer (second spacer layer) 104 composed of a semiconductor material and disposed on the MQW active layer 103. In the following description, the n-DBR 101, the n-clad layer 102, the MQW active layer 103, and the p-clad layer 104 may sometimes be collectively referred to as "semiconductor laminate". The above-described layers are disposed in the same direction as shown in FIG. 1, and the expression "disposed on" has the meaning that each layer is disposed at a surface of the underlying layer in the direction in which the layers are disposed. Alternatively, the surface emitting laser according to the first embodiment may be configured to oscillate light in a state where the lower reflector is positioned at the upper side and the upper reflector is positioned at the lower side. Furthermore, although the layers other than the n-DBR 101 are sequentially disposed thereon in the first embodiment, the order in which the layers are disposed is not limited thereto.

The surface emitting laser according to the first embodiment further includes an ext-DBR (upper reflector) 105 provided above the p-clad layer 104 with an air gap (gap section) 110 interposed therebetween. Furthermore, an n-type electrode (first electrode) 120 is provided below the n-DBR 101, and a p-type electrode (second electrode) 121 is provided on the p-clad layer 104, where appropriate.

The n-DBR 101 is a distributed reflective mirror constituted of multiple pairs of layers. Each pair includes two layers with different refractive indices, and each layer has a thickness of $\lambda_0/4n_{\mathit{eff}}$. The central wavelength of a reflection band is substantially $\lambda_0$, and $n_{\mathit{eff}}$ denotes an equivalent refractive index.

The n-clad layer 102, the MQW active layer 103, and the p-clad layer 104 constitute a first resonator. The ext-DBR 105 is disposed above the first resonator with the air gap 110 interposed therebetween, such that the air gap 110 constitutes a second resonator.

When electric current is injected into the MQW active layer 103 by using the n-type electrode 120 and the p-type electrode 121, light is emitted. The light is then resonated at the first resonator and the second resonator so that light with a specific wavelength is oscillated in the vertical direction relative to the in-plane direction of the ext-DBR 105.

When the distance from the interface between the p-clad layer 104 and the air gap 110 to the interface between the upper reflector and the air gap 110 (i.e., a distance α in FIG. 1, which is the cavity length of the second resonator) changes, the phase of a standing wave at the interface between the first resonator and the second resonator changes. The phase change at this interface occurs smoothly over a wide phase range so that the laser oscillation wavelength can be varied over a wide wavelength range.

As a condition for achieving this wide wavelength variability, the interface between the first resonator and the second resonator should be located near a node of a standing wave at the central wavelength $\lambda_0$ of the variable wavelength range. In detail, an optical path length $n_{\mathit{eff}} \times d$ extending from an interface A between the n-DBR 101 and the n-clad layer 102 to an interface B between the p-clad layer 104 and the air gap 110 should satisfy the relationship according to expression (1) below. In the case of FIG. 1, an optical thickness (optical path length) $n_{\mathit{eff}} \times d$ of the first resonator constituted of the three layers, i.e., the n-clad layer 102, the MQW active layer 103, and the p-clad layer 104, should satisfy the relationship according to expression (1) below.

$$(ma/2+3/16)\lambda_0 \leq n_{\mathit{eff}} \times d \leq (ma/2+3/8)\lambda_0 \quad (1)$$

In expression (1), ma denotes an integer of 2 or larger, and $n_{\mathit{eff}}$ denotes an equivalent refractive index of the layers interposed between the interface A between the n-DBR 101 and the n-clad layer 102 and the interface B between the p-clad layer 104 and the air gap 110. In other words, in the case of FIG. 1, $n_{\mathit{eff}}$ denotes an equivalent refractive index of the first resonator.

Moreover, $\lambda_0$ denotes a central wavelength of a reflection band of the n-DBR 101 or the ext-DBR 105.

In the example shown in FIG. 1, a drive unit 130 serving as a control mechanism is used to move the ext-DBR 105 so as to change the distance α, whereby a wavelength-variable surface emitting laser is achieved. As an example of such a mechanism for varying the oscillation wavelength, a mechanism that moves the laminate without moving the ext-DBR 105 may be provided, or a mechanism that moves both the ext-DBR 105 and the laminate may be provided. Furthermore, by using the drive unit 130, an ext-DBR 105 fabricated by employing a micro-electro mechanical system (MEMS) technology may be moved back and forth at high speed in the vertical direction relative to the in-plane direction of the upper reflector so that the wavelength of light to be oscillated can be varied at high speed.

Since the number of existing modes decreases with decreasing distance between the interface A and the interface B, the variable wavelength range becomes larger. Therefore, it is desirable that ma in expression (1) is as small as possible. In particular, it is desirable that ma is equal to 2.

Furthermore, in the surface emitting laser according to the first embodiment, it is desirable that the optical path length $n_{eff} \times d$ satisfy the relationship according to expression (2) below.

$$(ma/2+1/4)\lambda_0 \leq n_{eff} \times d \leq (ma/2+5/16)\lambda_0 \qquad (2)$$

In expression (2), ma, $\lambda_0$, $n_{eff}$, and d are the same as those described above.

As will be described later, when the distance $n_{eff} \times d$ is set so as to satisfy expression (2), the variable range for the wavelength of light to be oscillated is further increased.

The surface emitting laser according to the first embodiment may be provided with a layer or layers other than the layers 101 to 105 described above within the scope of the present invention. For example, a freely-chosen layer may be provided between the first spacer layer 102 and the active layer 103 or between the active layer 103 and the second spacer layer 104.

It is desirable that a dielectric layer be not provided between the second spacer layer 104 and the gap section 110.

Lower Reflector and Upper Reflector

Although the upper reflector and the lower reflector in the first embodiment are not particularly limited, they are desirably multilayer reflectors in which low-refractive-index layers and high-refractive-index layers are alternately disposed. The low-refractive-index layers and high-refractive-index layers may each have a thickness of, for example, $\lambda_0/4n_{eff}$. In this case, the equivalent refractive index $n_{eff}$ denotes the refractive index of a material. In the case where each layer is composed of a single kind of material, the equivalent refractive index $n_{eff}$ denotes the refractive index of that material. In the case where each layer is composed of multiple kinds of materials, the equivalent refractive index $n_{eff}$ can be determined as a total value obtained by weighting the percentages of the refractive indices of the materials.

The lower reflector is desirably an n-type semiconductor multilayer reflector, and the upper reflector is desirably a dielectric multilayer reflector.

The upper reflector and the lower reflector have the same $\lambda_0$ (i.e., the central wavelength of the reflection wavelength band). The central wavelength of the reflection wavelength band of each of the upper reflector and the lower reflector can be determined as follows. First, light is radiated onto the upper reflector or the lower reflector. Then, the relationship between the wavelength of the reflected light and the reflectivity is calculated. The central wavelength is determined as an intermediate value of two wavelengths at which the reflectivity is 90%.

First Spacer Layer

The first spacer layer according to the first embodiment may be composed of, for example, $Al_xGa_{(1-x)}As$ (x ranging between 0 and 1) and has a function of adjusting the refractive index between the lower reflector and the active layer. The refractive-index adjustment is performed by changing the thickness of the layer or by changing the aforementioned x value. The first spacer layer is desirably an n-type spacer layer. Alternatively, the spacer layer may be a clad layer.

Active Layer

The active layer according to the first embodiment may be composed of, for example, $Al_xGa_{(1-x)}As$ (x being an integer ranging between 0 and 1) or $In_yGa_{(1-y)}As$ (y being an integer ranging between 0 and 1).

Second Spacer Layer

The second spacer layer according to the first embodiment may be a semiconductor composed of, for example, $Al_xGa_{(1-x)}As$ (x being an integer ranging between 0 and 1) and has a function of adjusting the refractive index between the upper reflector and the active layer. The refractive index of $Al_xGa_{(1-x)}As$ is known to range between 2.9 and 3.6.

The second spacer layer is desirably a p-type spacer layer. Since other features are similar to those of the first spacer layer, descriptions thereof will be omitted.

Gap Section

Although the gap section according to the first embodiment is normally formed of air, the gap section may exist in the form of another kind of gas, a liquid, or vacuum so long as the surface emitting laser oscillates light with a desired wavelength.

Optical Path Length

The optical path length in the first embodiment is a value obtained by multiplying a physical distance by the equivalent refractive index of a material existing within that distance.

For example, in a case where a material with an equivalent refractive index $n_{eff}$ exists within a distance d, the optical path length would be $n_{eff} \times d$.

Technically speaking, although there may be various kinds of optical paths in the surface emitting laser, the term "optical path length" in the present invention and in this specification refers to an optical path length of light that resonates between the lower reflector and the upper reflector, unless otherwise noted. Therefore, in the case where the reflectors and the layers are disposed parallel to one another, the optical path length can be calculated on the basis of the physical distance in the thickness direction of the reflectors and the layers.

Second Embodiment

Figure 2:
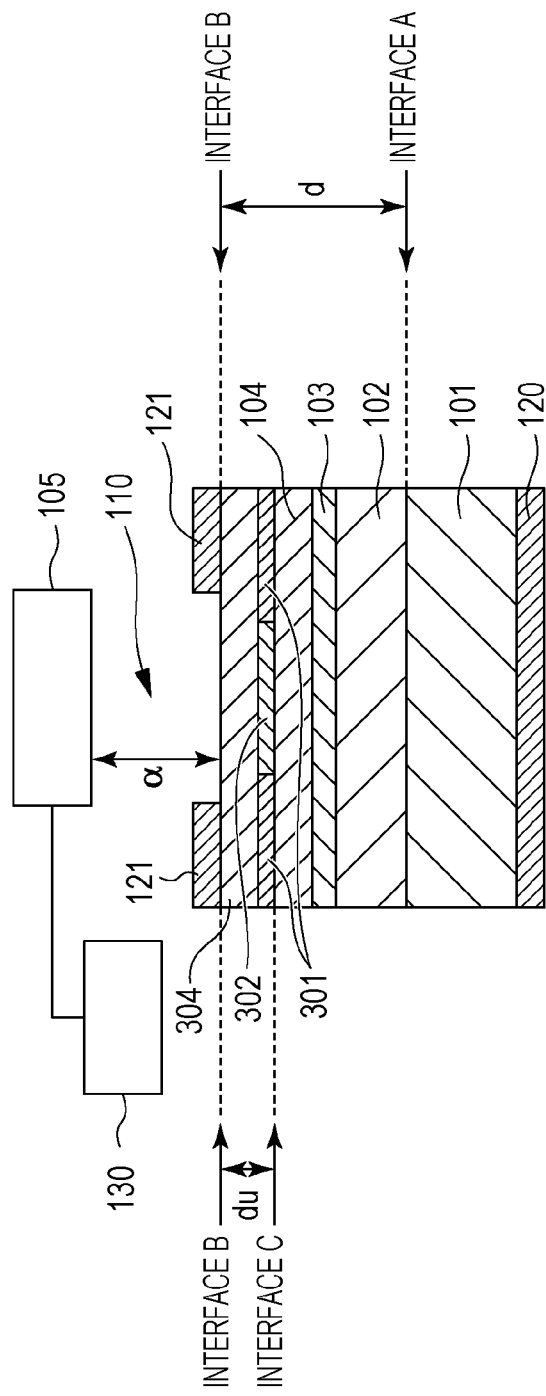
FIG. 2 is a schematic cross-sectional view of a surface emitting laser according to a second embodiment of the present invention.

Although a surface emitting laser according to a second embodiment will be described below with reference to FIG. 2, the following omits descriptions of features similar to those in the first embodiment and focuses on features different therefrom. Moreover, layers with functions that are the same as those in FIG. 1 are given the same reference numerals. The second embodiment differs from the first embodiment in that layers (i.e., a peripheral oxidized region 301 and a non-oxidized region 302) that form a current confinement structure are added on the p-clad layer 104, and that a second p-clad layer 304 is disposed on the current confinement structure.

With the current confinement structure, electric current injected from the p-type electrode 121 cannot flow through the peripheral oxidized region 301, which has been insulated by oxidization, causing the electric current to concentrate in the non-oxidized region 302, which is electrically conductive. By utilizing this current confinement structure to cause the injected electric current to concentrate in the narrow central region, laser oscillation of the VCSEL can be made to occur with a low injected electric current, and single transverse mode oscillation can be realized.

This non-oxidized region 302 may be, for example, an AlGaAs layer with an Al composition of 0.95 or greater, and due to having a refractive index lower than those of the p-clad layer 104 and the second p-clad layer 304, the non-oxidized region 302 affects the light intensity distribution within the semiconductor resonator. In order to minimize the effect on the variable wavelength characteristics, it is necessary to dispose the non-oxidized region 302 at an optimal position within the semiconductor resonator.

In detail, the non-oxidized region 302 contacts the p-clad layer 104, and du denotes the distance from an interface C between the non-oxidized region 302 and the p-clad layer 104 to an interface B between the second p-clad layer 304 and the air gap 110 (i.e., from the interface at the MQW active layer 103 side of the layers constituting the current confinement structure to the interface between the second spacer layer and the air gap 110). In the case of FIG. 2, the optical thickness (optical path length) $n_{\it eff} \times du$ of the laminate formed of the AlGaAs layer 302 with the high Al composition and the second p-clad layer 304 needs to satisfy expression (3) below.

$$(mb/2+3/16)\lambda_0 \leq n_{\it eff} \times du \leq (mb/2+3/8)\lambda_0 \quad (3)$$

In expression (3), mb denotes an integer of 0 or larger, and $n_{\it eff}$ denotes an equivalent refractive index of the layers interposed between the interface C between the non-oxidized region 302 and the p-clad layer 104 and the interface B between the second p-clad layer 304 and the air gap 110. In other words, in the case of FIG. 2, $n_{\it eff}$ denotes an equivalent refractive index of the non-oxidized region 302 and the second p-clad layer 304. Moreover, $\lambda_0$ denotes a central wavelength of a reflection band of the n-DBR 101 or the ext-DBR 105, and du denotes a thickness of the laminate formed of the AlGaAs layer 302 with the high Al composition and the second p-clad layer 304.

The non-oxidized region 302 of the current confinement structure is desirably composed of $Al_xGa_{(1-x)}As$ (x being an integer that satisfies 0.95≤x≤1). With this composition, the oxidization process can be performed with high controllability, and a current confinement structure with high reproducibility can be formed. Moreover, with the above-described composition, the non-oxidized region 302 has a refractive index lower than that of the second spacer layer 104 so as to affect the light intensity distribution within the semiconductor resonator. In order to minimize the effect on the variable wavelength characteristics, it is necessary to dispose the non-oxidized region 302 at an optimal position within the semiconductor resonator. The range shown in expression (3) defines this optimal position.

In a case where an oxidized confinement structure is provided, the second spacer layer in the second embodiment would be separated into two regions (i.e., a p-clad layer and a second p-clad layer) in the vertical direction relative to the in-plane direction with the oxidized confinement structure interposed therebetween. In this case, the optical thickness (optical path length) $n_{\it eff} \times du$ of the semiconductor laminate including the oxidized confinement structure satisfies expression (1).

Optical Coherence Tomography Apparatus

An optical coherence tomography apparatus (sometimes referred to as "OCT apparatus" hereinafter) equipped with a wavelength-variable laser does not use a spectroscope and is therefore expected to acquire a high signal-to-noise (SN) ratio tomographic image with a reduced loss of light.

Figure 3:
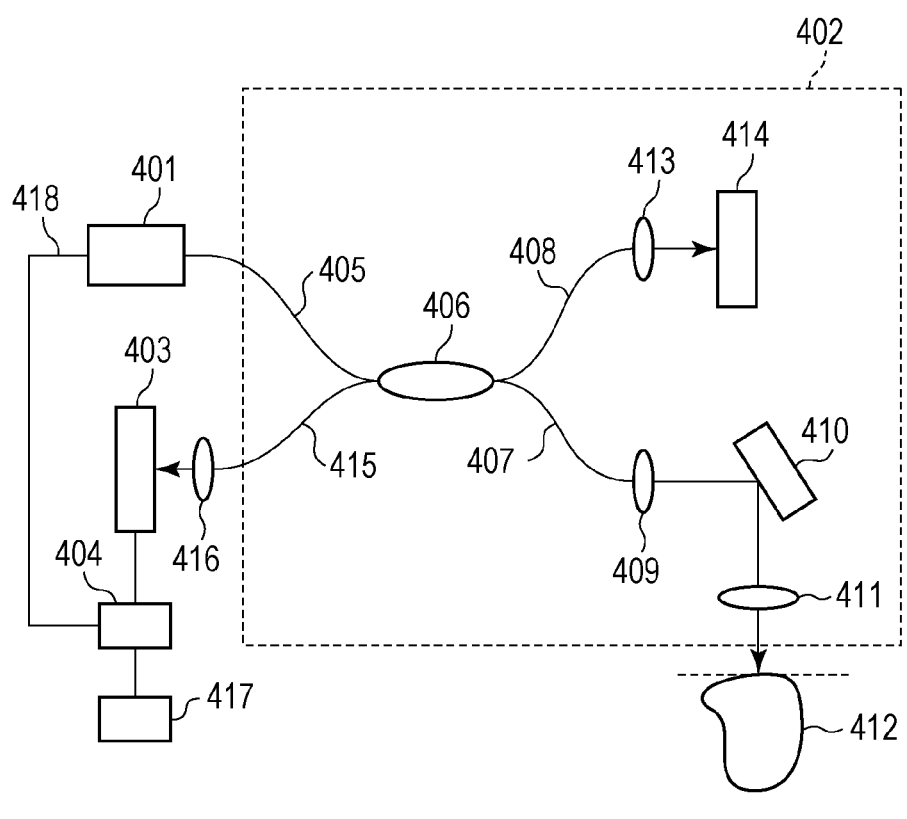
FIG. 3 illustrates an optical coherence tomography apparatus equipped with the surface emitting laser according to the first or second embodiment of the present invention.

Because the surface emitting laser according to the first or second embodiment is a wavelength-variable laser with a wide variable wavelength range, tomographic image information with high depth resolution can be acquired by using this laser as a light source of an OCT apparatus. An OCT apparatus will be described below with reference to FIG. 3.

An OCT apparatus according to an embodiment at least includes a light source unit 401, an interference optical system 402, a light detecting unit 403, and an information acquisition unit 404. The light source unit 401 is the surface emitting laser according to one of the embodiments described above. Although not shown, the information acquisition unit 404 has a Fourier transform unit. In this case, with regard to the expression "the information acquisition unit 404 has a Fourier transform unit", the configuration is not particularly limited so long as the information acquisition unit 404 has a function of performing Fourier transform on input data. As one example, the information acquisition unit 404 has an arithmetic unit, and the arithmetic unit has a Fourier transform function. In detail, the arithmetic unit is a computer having a central processing unit (CPU), and this computer contains an application having a Fourier transform function. As another example, the information acquisition unit 404 has a Fourier transform circuit having a Fourier transform function. Light exiting the light source unit 401 travels through the interference optical system 402 and is output therefrom as interference light having information about a measurement object 412. The interference light is received by the light detecting unit 403. The light detecting unit 403 may be of a differential detector type or of a simple intensity monitor type. Information about the time-domain waveform of the intensity of the received interference light is transmitted from the light detecting unit 403 to the information acquisition unit 404. The information acquisition unit 404 acquires a peak value of the time-domain waveform of the intensity of the received interference light and performs Fourier transform thereon so as to acquire information about the object 412 (e.g., tomographic image information). The light source unit 401, the interference optical system 402, the light detecting unit 403, and the information acquisition unit 404 described above may be arbitrarily provided.

A detailed description of how the tomographic image information of the measurement object 412 is acquired after the light is emitted from the light source unit 401 will be provided below.

The light emitted from the light source unit 401 that varies the wavelength of the light travels through a fiber 405 and enters a coupler 406 where the light is split into irradiation light traveling through an irradiation-light fiber 407 and reference light traveling through a reference-light fiber 408. The coupler 406 may be of a type that is in a single mode in the wave band of the light source unit 401, and each kind of fiber coupler may be a 3-dB coupler. The irradiation light becomes collimated light by traveling through a collimator 409 and is then reflected by a mirror 410. The light reflected by the mirror 410 travels through a lens 411, is radiated onto the object 412, and is then reflected from each layer of the object 412 in the depth direction thereof. On the other hand, the reference light travels through a collimator 413 and is then reflected by a mirror 414. At the coupler 406, interference light is generated by the reflected light from the object 412 and the reflected light from the mirror 414. The interference light travels through a fiber 415, is collected by traveling through a collimator 416, and is then received by the light detecting unit 403. Information about the intensity of the interference light received by the light detecting unit 403 is converted into electrical information, such as voltage information, which is then transmitted to the information acquisition unit 404. The information acquisition unit 404 performs Fourier transform on interference-light intensity data so as to acquire tomographic image information. Normally, this interference-light intensity data on which Fourier transform is performed is data sampled at regular wave number intervals. Alternatively, data sampled at regular wavelength intervals may be used.

The information acquisition unit 404 may transmit the acquired tomographic image information to an image display unit 417 where the image may be displayed. By scanning the mirror 410 in a plane that is perpendicular to the incident direction of the irradiation light, a three-dimensional tomographic image of the measurement object 412 can be acquired. Furthermore, the light source unit 401 may be controlled by the information acquisition unit 404 via an electric circuit 418. Although not shown, the intensity of the light exiting the light source unit 401 may be sequentially monitored, and the obtained data may be used for amplitude correction of an interference-light intensity signal.

Because the surface emitting laser according to each of the first and second embodiments is capable of sweeping the wavelength in a broad wave band at high speed, tomographic image information with high depth resolution can be acquired at high speed. This OCT apparatus is useful for the acquisition of a tomographic image in, for example, ophthalmological, dental, and dermatological fields.

APPLICABILITY

In addition to being used in the aforementioned OCT apparatus, the surface emitting laser according to each of the first and second embodiments can be used as an optical communication light source or an optical measurement light source. In the optical communication field, an increase in the number of multiplexed wavelengths according to a wide variable wavelength band is possible.

EXAMPLES

Example 1

A surface emitting laser according to Example 1 of the present invention will be described below by referring to FIG. 1 again.

In FIG. 1, the n-DBR 101 formed of an n-type $Al_{0.15}GaAs$ layer and an AlAs layer, the n-clad layer 102 composed of n-type $Al_{0.6}Ga_{0.4}As$, the MQW active layer 103 composed of $In_{0.08}Ga_{0.92}As/Al_{0.3}Ga_{0.7}As$, and the p-clad layer 104 composed of p-type $Al_{0.6}Ga_{0.4}As$ are stacked on an n-type GaAs substrate (not shown), and the p-type electrode 121 is disposed along the periphery of the upper surface of the p-clad layer 104 with a contact layer (not shown) interposed therebetween. The back surface of the n-type GaAs substrate is provided with the n-type electrode 120. The components described above (i.e., the components excluding the n-type GaAs substrate) will be referred to as "VCSEL unit".

The ext-DBR 105 disposed above the VCSEL unit with the air gap 110 interposed therebetween is a DBR that is disposed on a silicon membrane formed by a known MEMS technology and that is composed of $SiO_2$ and $TiO_2$. The ext-DBR 105 is disposed facing the VCSEL unit formed on the GaAs substrate.

The central wavelength of the reflection band of each of the n-DBR 101 and the ext-DBR 105 is about 850 nm, and each of the $Al_{0.15}Ga_{0.85}As/AlAs$ and $SiO_2/TiO_2$ layers respectively constituting the n-DBR 101 and the ext-DBR 105 has a thickness of $\lambda_0/4n_{eff}$ ($n_{eff}$ denoting an equivalent refractive index of each layer).

The ext-DBR 105 is disposed on a silicon membrane formed by a known MEMS technology, and the reflectivity of the DBR is set to be slightly smaller than that of the n-DBR 101. Oscillation light is emitted to the outside from this ext-DBR 105. The ext-DBR 105 on the membrane is moved away from the VCSEL unit on the GaAs substrate by static electricity, thereby changing the distance α of the air gap 110.

The first resonator formed by the n-clad layer 102, the MQW active layer 103, and the p-clad layer 104 is given a thickness of $(3+\frac{1}{4})\lambda_0/n_{eff}$ ($n_{eff}$ denoting an equivalent refractive index of the n-clad layer 102, the MQW active layer 103, and the p-clad layer 104), and the MQW active layer 103 is disposed at a position where the light intensity distribution is at a maximum.

Figure 4A:
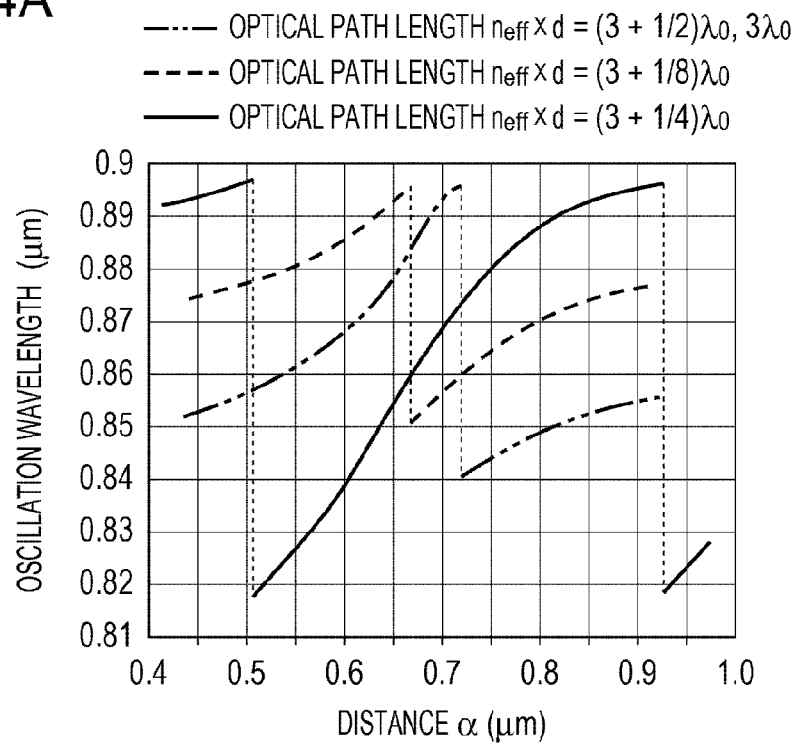
FIGS. 4A and 4B illustrate results obtained by calculating an oscillation wavelength when surface emitting lasers according to Examples of the present invention are used.
Figure 4B:
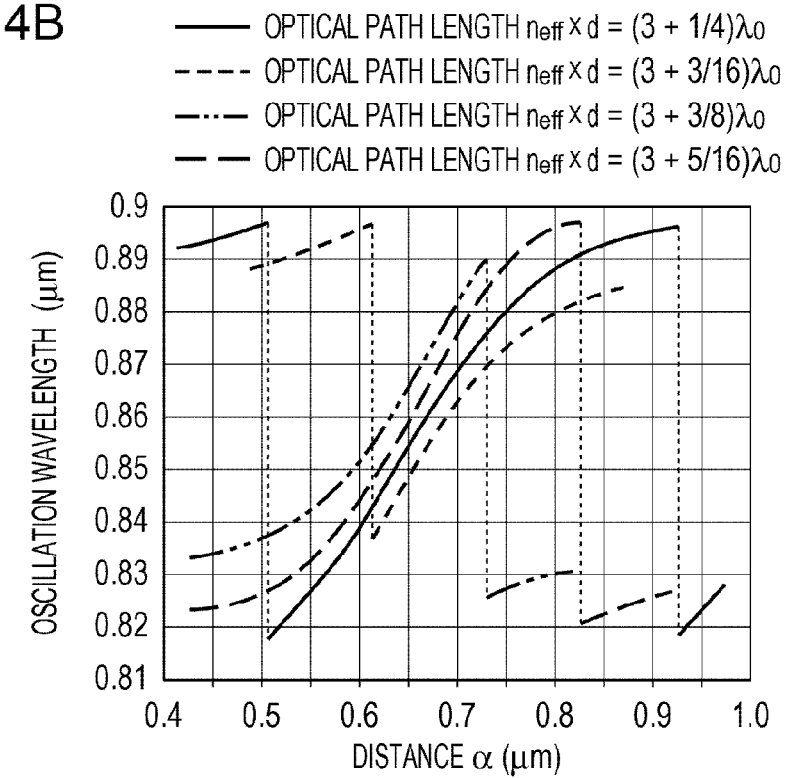

In the above-described configuration, laser oscillation is made to occur by applying electricity between the p-type electrode 121 and the n-type electrode 120 of the VCSEL unit. FIGS. 4A and 4B illustrate the dependency of the laser oscillation wavelength relative to a change in the air-gap distance α (μm) caused by moving the ext-DBR 105.

In FIG. 4A, the laser oscillation wavelength changes from 0.817 μm to 0.895 μm in correspondence with a change in the air-gap distance α from 0.5 μm to 0.93 μm.

FIG. 4A also illustrates the dependency of the laser oscillation wavelength in accordance with a comparative example in which the optical path length $n_{eff} \times d$ of the first resonator formed by the n-clad layer 102, the MQW active layer 103, and the p-clad layer 104 is set to $3\lambda_0$, $(3+\frac{1}{8})\lambda_0$, and $(3+\frac{1}{2})\lambda_0$. It is shown that, by setting the length of the first resonator to $(3+\frac{1}{4})\lambda_0$, the wavelength can be varied over a wide range.

FIG. 5 illustrates the relationship between the optical path length $n_{eff} \times d$ of the first resonator and the oscillation-wavelength variable range. Example 1 according to the present invention corresponds to cases where $n_{eff} \times d$ is set to $(3+\frac{3}{16})\lambda_0$, $(3+\frac{1}{4})\lambda_0$, $(3+\frac{5}{16})\lambda_0$, and $(3+\frac{3}{8})\lambda_0$, whereas the comparative example corresponds to the remaining cases.

FIG. 4B shows examination results of the air-gap distance dependency of the variable wavelength characteristics when the optical path length $n_{eff} \times d$ of the first resonator is close to $(3+\frac{1}{4})\lambda_0$. When $n_{eff} \times d$ ranges between $(3+\frac{3}{16})\lambda_0$ and $(3+\frac{3}{8})\lambda_0$, a relatively wide variable wavelength range is achieved.

The above results indicate that the wavelength can be varied over a wide range when the optical path length of the first resonator is close to $3\lambda_0$. However, since the standing wave within the first resonator has periodicity with respect to $\lambda_0/2$, and $\lambda_0/4$ and $3\lambda_0/4$ are equivalent to each other, the optical path length $n_{eff} \times d$ of the first resonator constituted of the n-clad layer 102, the MQW active layer 103, and the p-clad layer 104 for obtaining the variable wavelength range of laser oscillation is expressed by expression (1) discussed in the first embodiment.

Example 2

A surface emitting laser according to Example 2 of the present invention will be described below by referring to FIG. 2 again.

In Example 2, the current confinement structure is provided on the p-clad layer 104, and the $Al_xGa_{(1-x)}As$ layer 302 (x>0.95), which has an Al composition higher than that of the p-clad layer 104, and the second p-clad layer 304 are disposed. Due to an insulated layer (peripheral oxidized region) 301 formed by oxidizing the periphery of the AlGaAs layer 302 having the high Al composition, electric current concentrates in the non-oxidized central region. With this current confinement structure, laser oscillation of the VCSEL can be made to occur with a low injected electric current, and single transverse mode oscillation can be realized.

In a wavelength-variable VCSEL, a single transverse mode and a low threshold current value by the current confinement structure are still necessary. However, due to having a refractive index lower than those of the p-clad layer 104 and the second p-clad layer 304, the AlGaAs layer 302 with the high Al composition affects the light intensity distribution within the resonator. Therefore, in order to minimize the effect on the variable wavelength characteristics, it is necessary to dispose the AlGaAs layer 302 at an optimal position. Since other configurations, functions, and movements are the same as those in Example 1, descriptions thereof will be omitted.

In Example 2, the optical thickness (optical path length) du of the laminate formed of the AlGaAs layer 302 with the high Al composition and the second p-clad layer 304 is set to $(\frac{1}{2}+\frac{1}{4})\lambda_0$.

This du corresponds to a case where mb=1 in expression (3) discussed in the second embodiment.

Accordingly, the effect the low refractive index of the AlGaAs layer 302 with the high Al composition has on the light intensity distribution is reduced, and a current path for allowing the electric current injected from the p-type electrode 121 to travel to the non-oxidized AlGaAs layer 302 is ensured, so that variable wavelength characteristics of the laser oscillation wavelength relative to the air-gap distance are realized similarly to those in Example 1.

FIG. 8 illustrates the relationship between the optical path length $n_{eff} \times du$ and the oscillation-wavelength variable range in a case where the surface emitting laser according to Example 2 is used. It is clear from FIG. 8 that wide wavelength variability can be achieved, as in Example 1.

Furthermore, similar to Example 1, due to the periodicity with respect to $\lambda_0/2$ and the equivalency between $\lambda_0/4$ and $3\lambda_0/4$, the optical path length $n_{eff} \times du$ of the first resonator is expressed by expression (3) discussed in the second embodiment.

Example 3

In a surface emitting laser according to Example 3, the variable wavelength range is set close to 1.0 μm, and the optical path length of the first resonator constituted of the n-clad layer 102, the MQW active layer 103, and the p-clad layer 104 in FIG. 1 is set close to $(1+\frac{1}{4})\lambda_0$.

In Example 3, the device structure is designed such that $\lambda_0$ is set to 1.075 μm, and the MQW active layer 103 is composed of $In_{0.38}Ga_{0.62}As/GaAs$ having a gain in the 1.0-μm band.

The n-clad layer 102 is composed of n-type $Al_{0.4}Ga_{0.6}As$, and the p-clad layer 104 is composed of p-type $Al_{0.4}Ga_{0.6}As$. The remaining configuration is the same as that in Example 1.

Similar to Example 1, a variation in the laser oscillation wavelength relative to a change in the air-gap distance α (μm) caused by moving the ext-DBR 105 is calculated. The results obtained are shown in FIGS. 9A and 9B.

Figure 9A:
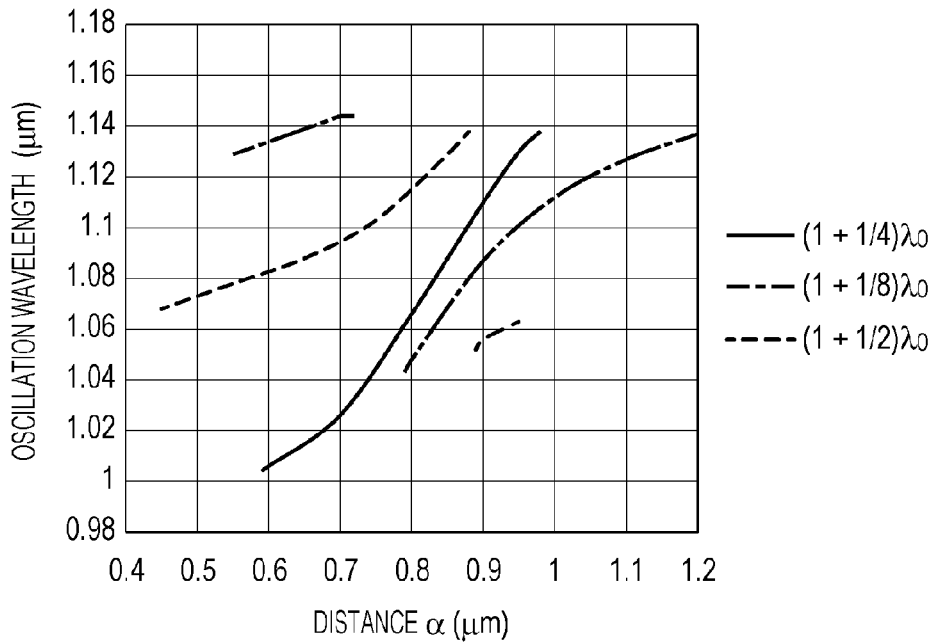
FIGS. 9A and 9B illustrate oscillation-wavelength calculation results obtained when a surface emitting laser according to Example 3 of the present invention is used.

FIG. 9A illustrates the variable wavelength characteristics when the optical path length $n_{eff} \times d$ of the first resonator is set to $(1+\frac{1}{8})\lambda_0$, $(1+\frac{1}{4})\lambda_0$, and $(1+\frac{1}{2})\lambda_0$. At $(1+\frac{1}{4})\lambda_0$, wide variable wavelength characteristics are obtained.

Figure 9B:
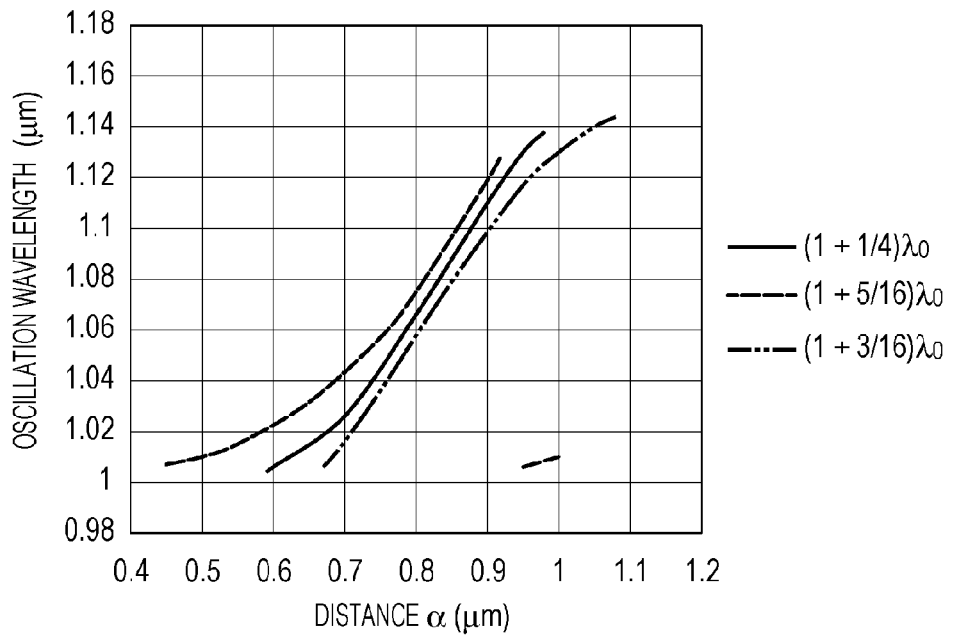

FIG. 9B illustrates a calculation result of the air-gap distance dependency of the oscillation wavelength when the optical path length $n_{eff} \times d$ of the first resonator is set close to $(1+\frac{1}{4})\lambda_0$. According to the result, the variable range for the oscillation wavelength is wide when the optical path length $n_{eff} \times d$ of the first resonator is between $(1+\frac{3}{16})\lambda_0$ and $(1+\frac{5}{16})\lambda_0$.

Furthermore, FIG. 10 illustrates calculation results of a variation in the oscillation wavelength when the optical path length $n_{eff} \times d$ of the first resonator is set to $(1+\frac{1}{8})\lambda_0$, $(1+\frac{3}{16})\lambda_0$, $(1+\frac{1}{4})\lambda_0$, $(1+\frac{5}{16})\lambda_0$, and $(1+\frac{3}{8})\lambda_0$.

The above results correspond to when ma=2 in expression (1) discussed above.

COMPARATIVE EXAMPLE

Figure 6:
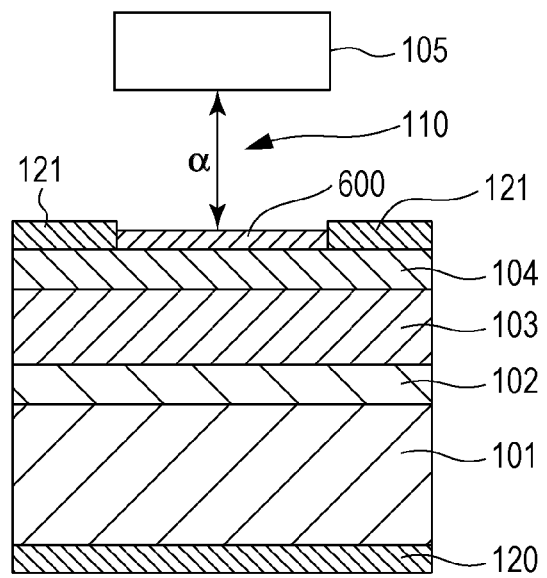
FIG. 6 illustrates the structure of a surface emitting laser corresponding to a related art technology.

FIG. 6 is a cross-sectional view of a surface emitting laser corresponding to a related art technology (IEEE Journal of Quantum Electronics, Vol. 46, No. 9, September 2010). In one of examples in Example 1, the optical path length $n_{eff} \times d$ extending from the interface (interface A) between the lower reflector 101 and the first spacer layer 102 to the interface (interface B) between the second spacer layer 104 and the air gap 110 is equal to $(3+\frac{1}{4})\lambda_0$. In contrast, in the structure corresponding to the related art technology shown in FIG. 6, the optical path length $n_{eff} \times d$ extending from the interface A to an interface between the second spacer layer and an antireflection layer (AR-layer) 600 is equal to $3\lambda_0$. Moreover, the distance α in FIG. 6 is the distance from the interface between the antireflection layer 600 and the air gap 110 to the interface between the air gap 110 and the upper reflector 105.

Figure 7:
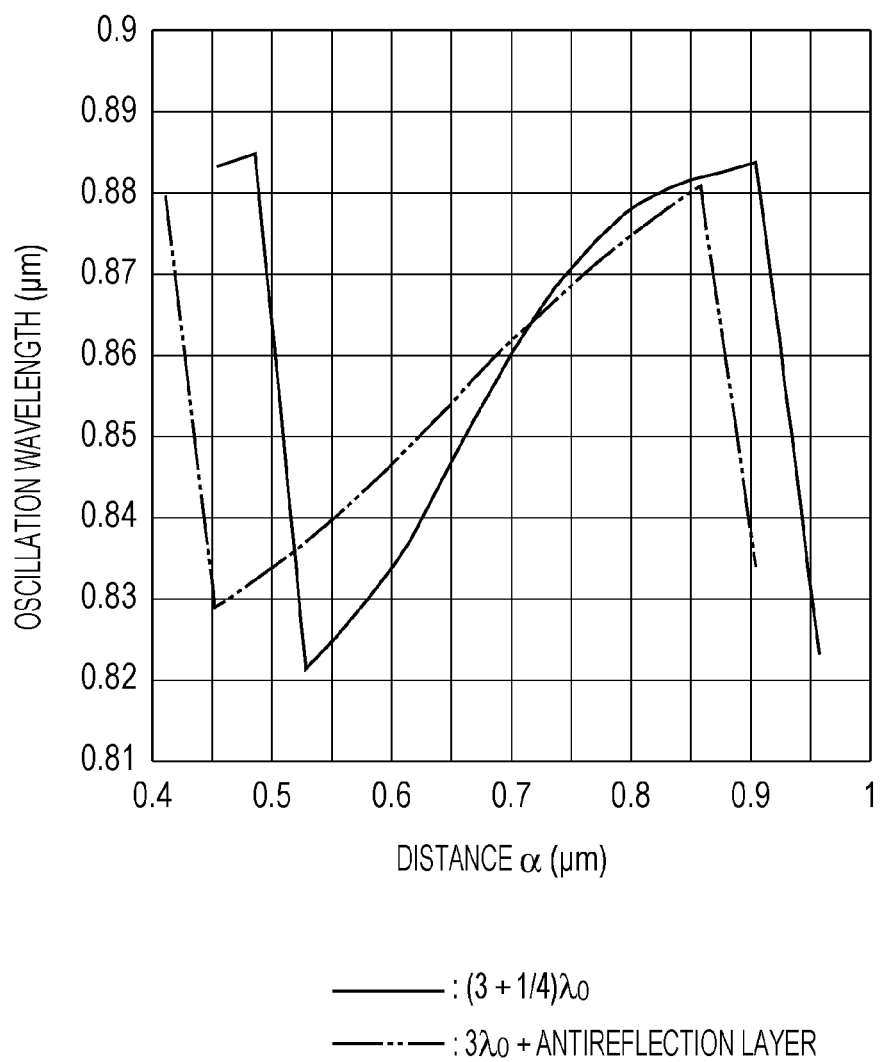
FIG. 7 is a diagram that compares the variable wavelength characteristics of the surface emitting laser according to Example 1 of the present invention and the surface emitting laser corresponding to the related art technology.

FIG. 7 illustrates the variable wavelength characteristics in Example 1 and in the structure corresponding to the related art technology. It is clear from FIG. 7 that Example 1 according to the present invention has wider variable wavelength characteristics.

With the surface emitting laser according to each embodiment of the present invention, the variable range for the wavelength of light to be oscillated can be increased.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-045585 filed Mar. 7, 2013, which is hereby incorporated by reference herein in its entirety.

What is claimed is:

1. A surface emitting laser comprising:
   a lower reflector;
   a first spacer layer;
   an active layer;
   a second spacer layer composed of a semiconductor material;
   a central non-oxidized region within a peripheral oxidized region;
   a third spacer layer composed of the semiconductor material;
   a gap section formed of at least one of vacuum and gas; and
   an upper reflector,
   wherein the lower reflector, the first spacer layer, the active layer, the second spacer layer, the central non-oxidized region, the third spacer layer, the gap section, and the upper reflector are disposed respectively,
   wherein the surface emitting laser varies a wavelength of light to emit by changing a distance between an interface between the third spacer layer and the gap section and an interface between the upper reflector and the gap section, and wherein, expressions (1) and (3) are satisfied:

$$(ma/2+3/16)\lambda_0 \leq n_{eff} \times d \leq (ma/2+3/8)\lambda_0 \quad (1)$$

$$(mb/2+3/16)\lambda_0 \leq n_{eff}' \times du \leq (mb/2+3/8)\lambda_0 \quad (3),$$

in which $n_{eff}$ denotes an equivalent refractive index of the layers interposed between a first interface between the lower reflector and the first spacer layer and a second interface between the third spacer layer and the gap section, d denotes a distance between the first interface and the second interface, ma denotes an integer of 2 or larger, and $\lambda_0$ denotes a central wavelength of a reflection wavelength band of the upper reflector or the lower reflector, $n_{eff}'$ denotes an equivalent refractive index of at least a layer disposed between the second interface and a third interface between the second spacer layer and the central non-oxidized region, du denotes a distance between the second interface and the third interface, mb denotes an integer of 0 or larger, and $\lambda_0$ denotes the central wavelength of the reflection wavelength band of the upper reflector or the lower reflector.

2. The surface emitting laser according to claim 1, wherein an optical path length $n_{eff} \times d$ satisfies a relationship according to expression (2):

$$(ma/2+1/4)\lambda_0 \leq n_{eff} \times d \leq (ma/2+5/16)\lambda_0 \quad (2).$$

3. The surface emitting laser according to claim 1, wherein the current confinement structure includes an $Al_xGa_{(1-x)}As$ layer and a layer obtained by partially oxidizing the $Al_xGa_{(1-x)}As$ layer, x being an integer that satisfies $0.95 \leq x \leq 1$.

4. The surface emitting laser according to claim 1, wherein the surface emitting laser varies a wavelength of light to emit by moving the upper reflector.

5. The surface emitting laser according to claim 1, wherein the upper reflector and the lower reflector are multilayer reflectors in which low-refractive-index layers and high-refractive-index layers are alternately disposed.

6. The surface emitting laser according to claim 1, wherein the lower reflector is an n-type semiconductor multilayer reflector, and the upper reflector is a dielectric multilayer reflector.

7. The surface emitting laser according to claim 1, wherein a dielectric layer for reducing reflection is not provided between the second spacer layer and the gap section.

8. An optical coherence tomography apparatus comprising:

a light source unit that changes a wavelength of light;

a coupler that splits the light from the light source unit into reference light and irradiation light to be radiated onto an object and that generates interference light in accordance with the reference light and reflected light of the light radiated onto the object;

a light detecting unit that receives the interference light; and a processor having an application that, when executed by the processor, acquires information about the object on the basis of a time-domain waveform of intensity of the interference light, the light source unit is the surface emitting laser according to claim 1.

9. The surface emitting laser according to claim 1, wherein ma is 6.

10. The surface emitting laser according to claim 1, wherein mb is 1.

* * * * *